US008570837B2

(12) United States Patent
Toda et al.

(10) Patent No.: US 8,570,837 B2
(45) Date of Patent: Oct. 29, 2013

(54) MULTILAYER BACKING ABSORBER FOR ULTRASONIC TRANSDUCER

(75) Inventors: Minoru Toda, Lawrenceville, NJ (US); Mitchell L. Thompson, Exton, PA (US)

(73) Assignee: Measurement Specialties, Inc., Hampton, VA (US)

(*) Notice: Subject to any disclaimer, the term of this patent is extended or adjusted under 35 U.S.C. 154(b) by 791 days.

(21) Appl. No.: 12/330,316

(22) Filed: Dec. 8, 2008

(65) Prior Publication Data

US 2009/0147627 A1 Jun. 11, 2009

Related U.S. Application Data

(60) Provisional application No. 61/005,584, filed on Dec. 6, 2007.

(51) Int. Cl.
*H04R 17/00* (2006.01)
*H01L 41/02* (2006.01)

(52) U.S. Cl.
USPC ............................ 367/176; 367/162; 310/327

(58) Field of Classification Search
USPC .................. 367/152, 162, 176; 310/326, 327
See application file for complete search history.

(56) References Cited

U.S. PATENT DOCUMENTS

| | | | | |
|---|---|---|---|---|
| 2,415,832 | A * | 2/1947 | Mason | 310/322 |
| 3,894,169 | A * | 7/1975 | Miller | 428/414 |
| 3,973,152 | A | 8/1976 | Karplus | |
| 4,090,153 | A | 5/1978 | Toda et al. | |
| 4,582,680 | A | 4/1986 | Bar-Cohen et al. | |
| 5,241,512 | A * | 8/1993 | Argy et al. | 367/1 |
| 5,629,906 | A * | 5/1997 | Sudol et al. | 367/162 |
| 6,234,990 | B1 * | 5/2001 | Rowe et al. | 604/22 |
| 6,541,896 | B1 | 4/2003 | Piel, Jr. et al. | |
| 6,814,618 | B2 | 11/2004 | Ishikawa et al. | |
| 2002/0044171 | A1 | 4/2002 | Hirahara et al. | |
| 2004/0095045 | A1 | 5/2004 | Baumgartner | |
| 2005/0236932 | A1 | 10/2005 | Nagahara et al. | |
| 2007/0016053 | A1 | 1/2007 | Lo et al. | |
| 2007/0040476 | A1 | 2/2007 | Statnikov et al. | |

FOREIGN PATENT DOCUMENTS

GB 2063007 A1 * 5/1981

OTHER PUBLICATIONS

International Search Report dated Jan. 26, 2009 for related PCT Application No. PCT/US 08/85914.

* cited by examiner

*Primary Examiner* — Ian Lobo
(74) *Attorney, Agent, or Firm* — Howard IP Law Group, PC

(57) ABSTRACT

A multilayer backing absorber for use with an ultrasonic transducer comprises an elemental multilayer having at least one metal layer and at least one adhesive layer, wherein the backing absorber is adapted to be coupled to a vibrating layer of the ultrasonic transducer.

18 Claims, 10 Drawing Sheets

MULTILAYER BACKING ABSORBER FOR ULTRASONIC TRANSDUCER

CROSS REFERENCE TO APPLICATIONS

This application claims benefit of and priority to U.S. Provisional Patent Application Ser. No. 61/005,584, filed Dec. 6, 2007, which application is incorporated by reference herein in its entirety.

FIELD OF THE INVENTION

The present invention generally relates to a multilayer backing absorber for an ultrasonic transducer and more specifically relates to a multilayer backing absorber having an acoustic impedance and absorption adapted according to a desired sensitivity and/or bandwidth.

BACKGROUND OF THE INVENTION

Backing absorbers for ultrasonic transducers are typically comprised of metal particles and other binder composites. U.S. Pat. Nos. 3,973,152, 4,090,153, 4,582,680, and 6,814,618 describe such prior art backing absorbers. U.S. Pat. No. 3,973,152 describes a pressure applied to a multilayer metallic foil that performs as an absorber. However, such structures and techniques are deficient in several aspects. For example, ultrasonic waves do not propagate through relatively small gaps (e.g. gaps on the order of about 0.01 micrometer (um) or greater) between surfaces. Rather, ultrasonic waves are transmitted only through the small areas where the metal layers actually contact or are fused to one another.

Because the metal surface is not ideally flat and microscopic roughness exists, the actual or real contacting area represents a small fraction of the total surface area, and ultrasonic waves propagate through mostly in these small spots where absorption of acoustic waves takes place. This is the mechanism of attenuation of ultrasonic waves in pressurized multiple layers of metal foils. In order to cause the metal foils to be in substantially uniform contact without the aforementioned relatively small gaps, high pressure (e.g. about 50,000 psi (350 MPa) or more) has to be applied to permit acoustic waves to go through most of the boundary area. However, such a structure does not provide appropriate absorption. Therefore, the pressure has to be at a certain value which yields multiple spots of contact thereby providing appropriate attenuation to the waves. However, it is difficult to control the application of pressure in a constant and reproducible manner within this environment. For example, when applying high pressure, metal is usually fatigued and pressure decreases in time, thereby causing the absorption to decrease over time.

A further problem with the known multilayer backing absorber concerns the difficulty in designing the pressurizing structure. Piezoelectric materials such as PZT or crystal are brittle and easily broken by the applied pressure, and yet multiple layers of metallic foils have to be pressed against the piezoelectric layer. This requires that the piezoelectric material hold the pressure. If only the periphery of the multi layer foil is pressurized and the main central region is bonded to piezoelectric material, appropriate pressure cannot appear on each boundary of the multi layer structure. It is difficult to design such a structure, particularly when the size of the piezoelectric layer is thin (less than 0.5 mm) and large (more than 5 mm). Furthermore, the pressurizing structure, which typically includes screws and a holder, make the device bulky. Still further, the absorption and impedance cannot simply be designed to a specified value.

Backing absorbers are relatively difficult to manufacture and control the absorption and acoustic impedance of these devices. Many absorbers are comprised of heavy metal particles mixed with epoxy or polymer as a binder. The density difference makes sediment and thus requires thorough mixing. Moreover, casting must occur immediately after mixing to place the absorber in the desired shape. Such processes are difficult to control. Furthermore, mixing with correct ratios requires accurate weight measurements.

Such problems of difficulty in design, reproducibility and reliability are commonly seen for any absorber including the aforementioned examples. Alternative absorber structures and methods of making absorber structures are desired.

SUMMARY OF THE INVENTION

The general purpose of the present invention, which will be described subsequently in greater detail, is to provide a new multilayer backing absorber for ultrasonic transducers.

According to an aspect of the present invention, a multilayer backing absorber for ultrasonic transducers operative in thickness mode for example has an acoustic impedance and absorption adapted according to a given sensitivity and bandwidth. The novel multilayer backing absorber provides for transducer performance with a smooth frequency response curve without many spurious peaks.

Embodiments of the present invention comprise a transducer having a backing layer comprising layers of metal, polymer, and/or adhesive arranged so that a given impedance and absorption are obtained. Acoustic impedance and absorption for a structure of a plurality of metal deposited polymer layers bonded by adhesive are provided. Examples of acoustic impedance and absorption for structures of various metal layers bonded by adhesive are shown. Side boundaries between gross multiple layer regions with metal and without metal make some angles to the surfaces so that reflection from the back surface of the absorber does not reflect back to the piezoelectric layer. In one configuration, a multilayer absorber comprises a metal layer on each polymer layer and is configured as a periodic grating wherein the direction and period is different for each layer, and wherein the acoustic wave in the absorber is scattered or diffracted.

BRIEF DESCRIPTION OF THE FIGURES

Understanding of the present invention will be facilitated by consideration of the following detailed description of the preferred embodiments of the present invention taken in conjunction with the accompanying drawings, in which like numerals refer to like parts and in which.

DETAILED DESCRIPTION OF THE PREFERRED EMBODIMENTS OF THE INVENTION

Reference will now be made in detail to the present exemplary embodiments of the invention, examples of which are illustrated in the accompanying drawings. Wherever possible, the same reference numbers will be used throughout the drawings to refer to the same or like parts.

Figure 1A:
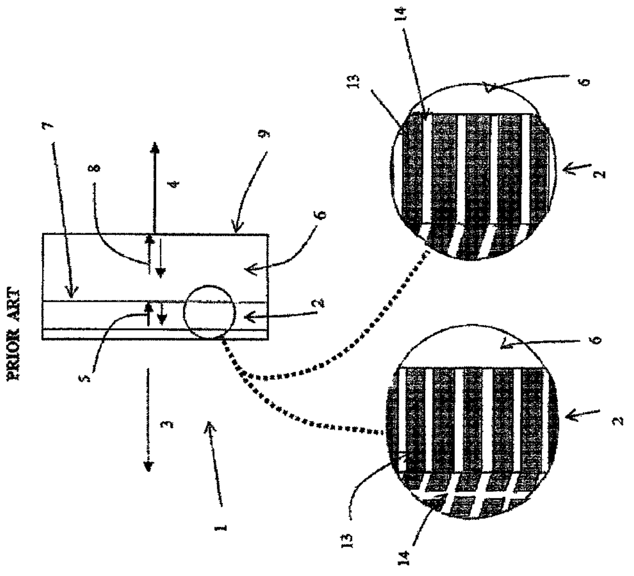
FIG. 1*a* is a schematic illustration of a conventional ultrasonic transducer.

FIG. 1*a* shows a structure 1 of a typical ultrasonic transducer operative in thickness vibration mode. Layer 2 represents a vibratory material layer such as a piezoelectric material layer 2, and is typically comprised of (but not limited to) a layer of PZT or single crystal, the thickness of which vibrates in the MegaHertz (MHz) frequency range in response to a stimulus such as an electrical signal applied to the transducer using drive circuitry or an incoming acoustic wave, as understood by one of ordinary skill in the arts. The material of layer 2 is not necessarily uniform but often a composite material of ceramic and polymer is used. An ultrasonic wave is radiated to the front direction 3 and used for its own purpose such as nondestructive diagnosis, imaging, or focused energy. A resultant generated back wave 4 (i.e. acoustic waveform propagating in the back direction 4) is not actively used and should be relatively weak.

Insets in FIG. 1*a* show a composite structure for piezoelectric layer 2. Inside of left circle A shows PZT posts 13 (1 dimensional) bound by a polymer 14 (3 dimensional) material which is called 1-3 composite. The right circle B shows PZT plates 13 (2 dimensional) bound by a polymer layer 14 (2 dimensional) and called 2-2 composite. These structures are often used in applications such as NDT (Non-destructive evaluation transducer) or medical imaging.

When a monolithic layer (or non-composite) of PZT is used in a thickness vibration mode, a feature of its vibration is compared with a composite structure as described. When the thickness dimension or direction expands during vibration, the dimensions of the planar directions have to become smaller. Conversely, when the thickness dimension shrinks, the planar dimensions have to expand. Since the planar dimensions are much larger than the wavelength, the piezoelectric layer cannot vibrate in these planar directions. This inability to vibrate in the planar directions suppresses the vibration in the thickness direction.

When PZT material is cut in the thickness direction so as to possess a small dimension relative to the planer direction, the vibration into the planar direction is enabled and thickness vibration is enhanced. This means the effective elastic constant in the thickness direction is lowered (becoming effectively a softer material) and its acoustic impedance is lowered. Further, the ultrasonic waveform is excited and also receives acoustic signals with higher sensitivity.

Still referring to FIG. 1*a*, an acoustic wave 5 propagating in piezoelectric material layer 2 is reflected at the interface boundary 7 with the backing material 6. If the acoustic impedance of backing material 6 is very different from that of piezoelectric material layer 2, reflection from the boundary 7 is strong and resonance in the piezoelectric material layer 2 takes place and the vibration at resonance becomes strong. However, the pulse signal also rings for too long a period. On the other hand, if the acoustic impedance of backing material 6 is sufficiently close to that of piezoelectric material 2, the reflection from the boundary 7 is weak and most of the acoustic wave energy is transmitted through the boundary 7 and absorbed by backing material 6. This results in weak resonance of the piezoelectric layer and vibration that is not strong, such that the excited front wave is also not sufficiently strong, thereby resulting in low sensitivity in excitation and reception as an ultrasonic transducer.

In the case described above the resonance bandwidth becomes too broad and sensitivity as a whole for the transducer structure 1 is not sufficiently high. If the absorption by the backing material 6 is not high enough, then the wave 8 is reflected at the end surface 9 of backing material 6 and propagates back to the piezoelectric material layer 2, generating multiple peaks on the frequency response curve by constructive or destructive interference and causing pulse waveform distortions. Thus the wave 8 transmitted into backing material 6 should be absorbed.

For an actual transducer, some suitable amount of reflection from boundary 7 is needed to provide the necessary sensitivity and bandwidth. The thickness of backing material 6 is limited by the available space for transducer structure 1 and the backward propagating wave 8 has to be absorbed while propagating and before reflecting off of end surface 9. Therefore, if a thick backing layer can be used, the backing layer absorption coefficient does not have to be very large for sufficient attenuation of the reflection. However, if the thickness of the backing material 6 has certain size (e.g. thickness) limitations, then the absorption coefficient has to be larger than that of a larger layer to achieve the desired result.

Depending on the piezoelectric material and structure (e.g. monolithic PZT plate, 1-3 or 2-2 composite, or single crystal), the acoustic impedance will vary and therefore the sensitivity and bandwidth are different. The impedance and attenuation of the backing absorber material may be adapted according to the particular requirements.

The acoustic impedance and absorption for a structure comprising a plurality of metal deposited polymer layers bonded by adhesive has performance features suitable for use as a practical backing absorber. The required bandwidth and sensitivity of an ultrasonic transducer may be different for different applications. There is a need to design the impedance and absorption which is suitable for the specific requirements. According to an aspect of the present invention, periodic structures with metal-adhesive multilayers and metal-polymer-adhesive multilayers adapted for mass-production are described herein. The impedances absorption and velocity are indicated by design equations.

The metal layers in the acoustic backing structure are relatively heavy and stiff. When the structure is vibrated during wave propagation the metal layers move but are not elastically deformed. The adhesive is comparatively soft and undergoes expansion/contraction due to the displacement of the metal layer. This motion gives the metal layers relatively high kinetic energy. Since the elastic loss factor of these adhesives is large, energy is lost through heat generation. This mechanism has high absorption. A polymer layer is somewhat stiffer than adhesive and has a similar role.

Figure 1B:
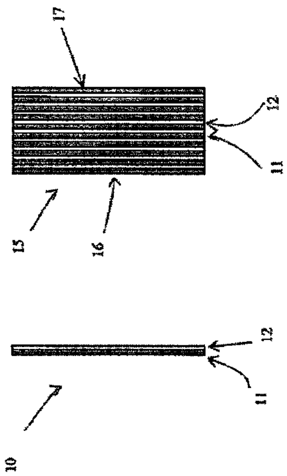
FIG. 1*b* is a schematic illustration of a two element multilayer absorber according to an embodiment of the invention.
Figure 1C:
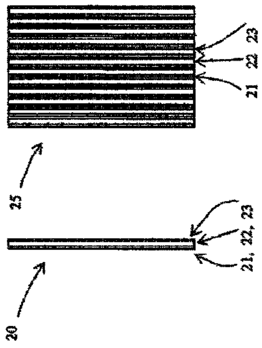
FIG. 1*c* is a schematic illustration of a three element multilayer absorber according to an embodiment of the invention.

Design equations of impedance, velocity and absorption and cut off frequency of a multilayer structure are given below. Referring to FIG. 1*b* there is shown a schematic illustration of a two element multilayer absorber according to an embodiment of the invention. In FIG. 1*b*, elemental layers 11 and 12 are metal and adhesive respectively, and a combined multilayer 15 is provided. FIG. 1*c* shows elemental layers 21, 22, 23 which in a preferred embodiment are copper, polymer, and adhesive, respectively, and a combined layer 25 is provided. Basic elemental layers in FIG. 1*b* are comprised of metal (e.g. copper) 11 and adhesive 12 (for example pressure sensitive adhesive or spray adhesive). In order to obtain sufficient absorption, multiple elemental layers 10 are combined to form a periodic structure, absorber 15. The impedance, absorption, and velocity of an absorber appropriate for the design of a particular transducer can be calculated from thicknesses, densities, velocities and Q values (mechanical quality factor or inverse of elastic loss factor). Q values of metals are several orders higher than those of adhesives and do not influence the performance of absorber because the metal does not encounter elastic deformation during the vibration.

In a repeated system of mass-spring-mass-spring etc. a longitudinal displacement wave propagates with a constant velocity for a frequency range below a certain frequency (cut off frequency, fc). The wave propagates a long distance if all the springs are ideally lossless. However, above fc, the wave attenuates (exponentially decays) strongly with propagation distance. In this system propagation therefore exists only below fc. From the basic equations of sequentially connected mass and lossy spring models, the wave velocity and impedance and absorption coefficients may be obtained. In this calculation each layer thickness is assumed to be much less than the wavelength. The resultant exemplary values of a multilayer absorber configured in accordance with the principles of the present invention are provided below. The weight per unit area of elemental layer $M=\rho_m h_m+\rho_a h_a$, and unit area spring constant $K=[(h_m/\rho_m V_m^2)+(h_a/\rho_a V_a^2)]^{-1}$, acoustic impedance $Z_o=(MK)^{1/2}$, average propagation velocity $V_0=(h_m+h_a)(K/M)^{1/2}$ and absorption coefficient $\alpha=(\omega/2Q_a V_0)$, where ρ is density, h is thickness, $V_m$ and $V_a$ are velocity in each material, and subscripts m and a stand for metal and adhesive. The relationships holds up to a maximum frequency, above that frequency the acoustic impedance starts to decrease and propagation does not exist at frequencies higher than fc for a lossless material. So the maximum frequency is defined as the cut off frequency, given by $f_c=(1/\pi)(K/M)^{0.5}$.

In the embodiment of FIG. 1*c*, there is shown an elemental multilayer structure comprised of three layers 21, 22, 23 having respective density $\rho_1$, $\rho_2$, $\rho_3$, thickness $h_1$, $h_2$, $h_3$ and velocity of $V_1$, $V_2$, $V_3$. Expressions of M and K are modified as follows. $M=\rho_1 h_1+\rho_2 h_2+\rho_3 h_3$ and $K=[(h_1/\rho_1 V^2)+(h_2/\rho_2 V_2^2)+(h_3/\rho_3 V_3^2)]^{-1}$ and $V_0=(h_1+h_2+h_3)(K/M)^{1/2}$. Three layers 20 of elemental multilayer structure represent a practically useful structure. With reference to FIG. 1*c*, there is described an example of typically used materials, where copper 21 is deposited on polymer layer 22 that is used for typical flexible printed circuit. These elemental layers are bonded by pressure sensitive adhesive 23 to form absorber 25. These elemental materials and processes of bonding are widely available in mass production.

Figure 2A:
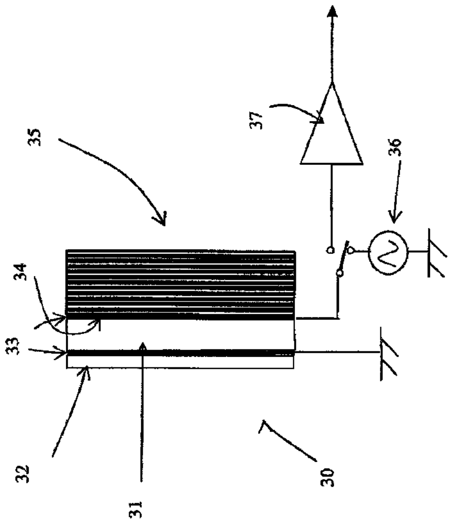
FIG. 2*a* is a schematic illustration of a multilayer absorber according to an embodiment of the invention combined with a piezoelectric layer forming an ultrasonic transducer.

FIG. 2*a* shows a typical use of the exemplary absorber for an ultrasonic transducer 30 wherein there is shown a piezoelectric material 31 such as PZT, front matching layer 32, electrodes 33, a multilayer absorber 35 attached at the back of the piezoelectric material, drive signal source 36, and amplifier 37 for the received signal. Furthermore, a multilayer structure of elements (11, 12 as per FIG. 1*b* or 21, 22, 23 per FIG. 1*c*) may be bonded to a PZT material so as to provide a structure of PZT-11-12-11-12-- (or PZT-21-22-23-21-22-23-21-22-23--). Alternatively, the structure of PZT-12-11-12-11-- (or PZT 23-22-21-23-22-21--) may also be provided.

Examples of acoustic impedance and absorption for structures of various metal layers bonded by adhesive are also provided. These exemplary embodiments may be suitable for use with 1-3 or 2-2 ceramic-polymer composite. Composite materials have lower acoustic impedance than a monolithic PZT plate. Measurements of material parameters were performed to obtain the high frequency material properties of adhesive and polymer in thin layer form, and density, propagation velocity, and material Q values were obtained. A first example of a design of a multilayer absorber using 50 um copper and 12 um adhesive with periodic ten combined elemental structure (N=10) has the impedance $Z_o$=9 MRayl and velocity $V_o$=1102 m/s (meters/second) and alpha (α)=3420/m at 6 MHz and cut off is at $f_c$=6.28 MHz. The attenuation during round trip is −34 dB (decibel). The total thickness is 620 um. This means the wave transmitted into the absorber has an attenuation of 34 dB when it comes back to the back plane of piezoelectric layer 34 where the absorber is attached. These results can be used for design of an ultrasonic transducer. A second example of another thickness combination is shown next, where 25 um copper and 25 um adhesive are used with ten periodic structures. The designed values are, $Z_o$=4.7 MRayl, $V_o$=925 m/s, α=7470/m at 5.5 MHz, fc=5.9 MHz and round trip attenuation is 24 dB, total thickness is 500 um. A third example comprises three elemental layers, 18 um copper, 25 um polyimide and 12 um pressure sensitive adhesive. The calculated values are $Z_o$=4.8 MRayl, $V_o$=1253 m/s, α=3008/m, with round trip attenuation 29 dB at 6 MHz for N=10, fc=7.25 MHz, and total thickness of 550 um.

Figure 2B:
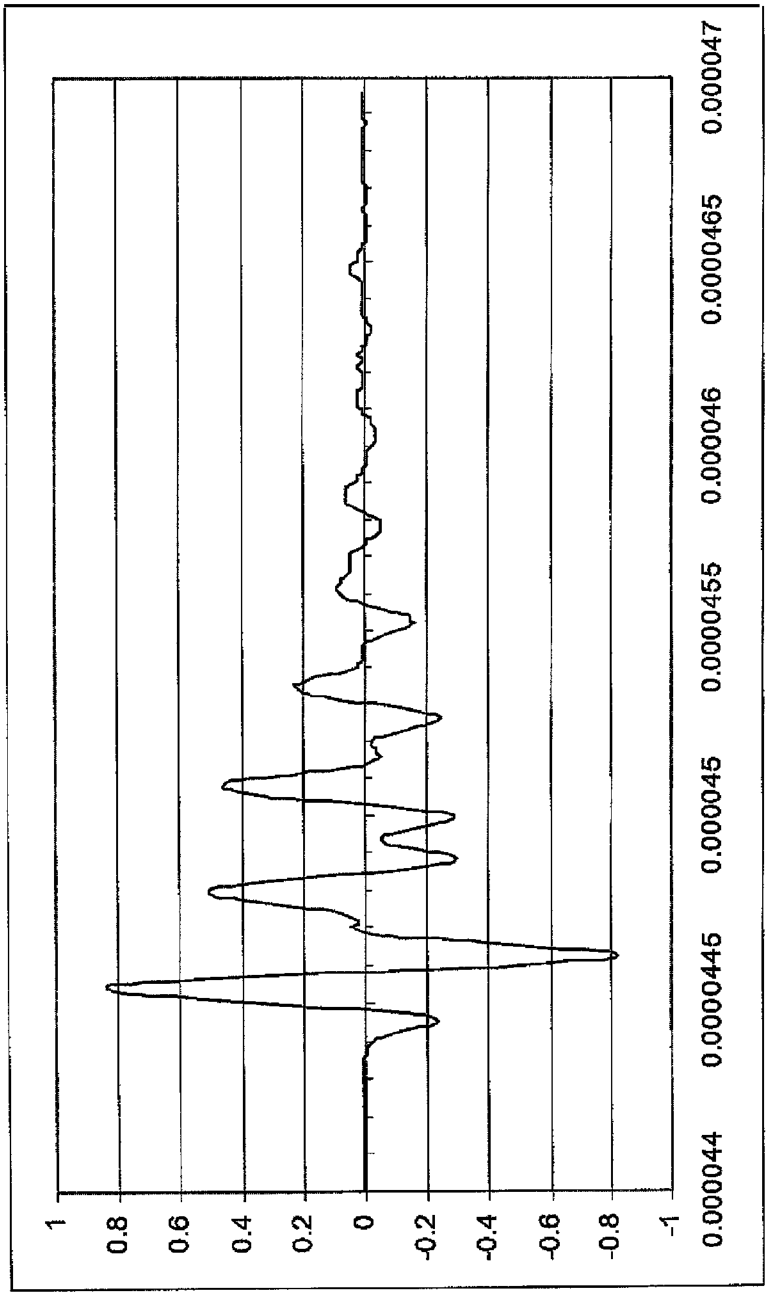
FIG. 2*b* is a measured waveform using front matching and multilayer absorber according to the principles of the present invention.
Figure 2C:
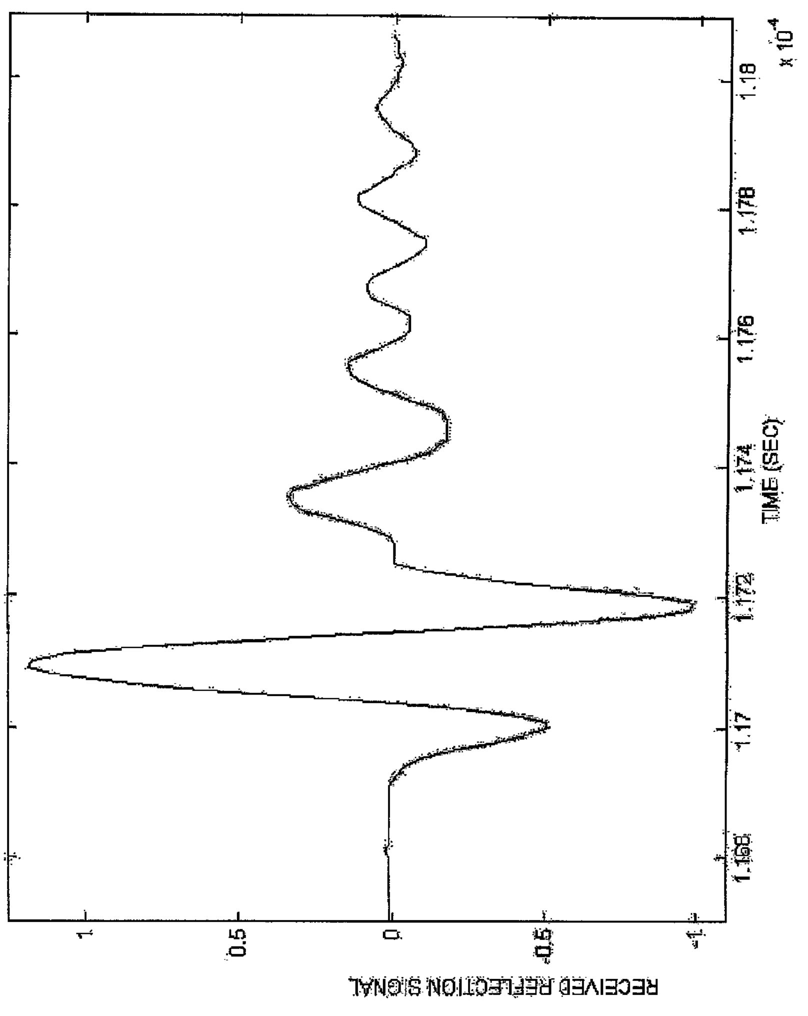
FIG. 2*c* is a measured waveform using front matching and multi-layer absorber for a 2-2 composite PZT transducer according to the principles of the present invention.

An exemplary embodiment of a multilayer absorber for a monolithic PZT platetransducer is also provided. The structure is same as the one shown in FIG. 2*a*. The transducer is a 330 μm thick ceramic plate made of PZT5H, with front matching layer of 110 μm polyvinylidene fluoride (PVDF) and a backing absorber composed of 10 sheets of 40 μm stainless steel bonded by 2.5 μm adhesive layers and total thickness of 0.42 mm with expected values of Zo=15.6 MRayl and Vo=2078. The transducer was immersed in water and an acoustic wave was launched towards a flat surface of a metallic block and a reflection was received by the same transducer. FIG. 2*b* shows the measured waveform (units of abscissa is seconds and ordinate is arbitrary). An excitation voltage comprised a sharp single voltage pulse. The acoustic wave was at 4 MHz and the oscillating wave quickly diminishes. For this embodiment, a non-composite PZT plate was used having an impedance roughly 2 times higher than a 1-3 or 2-2 composite and yet the observed signal quickly decays. Generally, making an absorber suitable for a PZT plate is more difficult than for a composite ceramic, particularly when the thickness of the absorber is limited and high absorption is required, and therefore this result indicates multiple layer backing absorber has superior performance as an absorber. In another exemplary embodiment a multilayer absorber for a 2-2 composite PZT transducer is provided. The structure is same as the one shown in FIG. 1*b*, right side of inset which is piezoelectric layer 31 in FIG. 2*a*. The transducer is a 330 μm thick ceramic plate made of PZT5H, with diced slots of 50 um filled by polymer, with front matching layer of 110 μm polyvinylidene fluoride (PVDF) and a backing absorber composed of 10 layers of 25 μm adhesive, 25 um polyimide and 38 um copper and total thickness of 0.88 mm. The transducer was immersed in water and an acoustic wave was launched towards a flat surface of a metallic block and a reflection was received by the same transducer. FIG. 2*c* shows the measured waveform (units of abscissa is seconds and ordinate is arbitrary). An excitation voltage comprised a sharp single voltage pulse. The acoustic wave was at 5.5 MHz and the oscillating wave quickly diminishes. For this embodiment, 2-2 composite PZT was used having a lower impedance than that of a monolithic plate of PZT and shows the rapid decay of such signals. This result indicates a multiple layer backing absorber has superior performance as an absorber.

Figure 3:
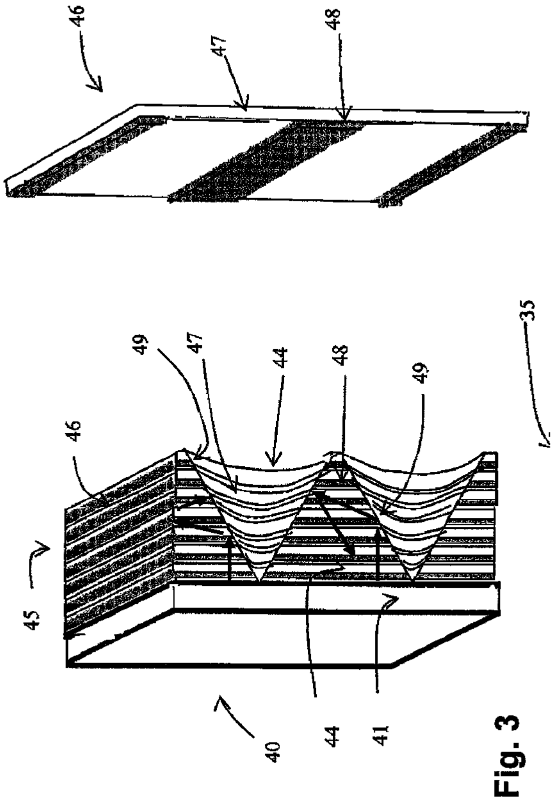
FIG. 3 is a schematic illustration of a graded boundary multilayer absorber combined with a piezoelectric layer according to an embodiment of the invention.

Depending on the design requirements, the total thickness of the multilayer absorber may become too thick, particularly when many layers have to be used for high attenuation or when the multilayer absorber has to be used in a low frequency region where the absorption becomes smaller. Reducing the total number of layers may not yield enough attenuation. In such a case, the boundary of the region of the metallic layer can be graded as shown in FIG. 3, where transducer 40 has a graded boundary absorber 45 bonded to piezoelectric material (i.e. PZT) 41. To form this graded boundary absorber, metal 48 on elemental layer 46 (only one layer is shown at the right side) is partially deposited on a selected area of polymer film 47. The metal area is different for each layer and gradually decreases towards the direction far from the back of the PZT material. Therefore, the boundary 49 is graded towards the back surface. The metallic area is thicker than the non metallic area so that the non-metallic area becomes recessed (this is the case of the elemental layers of adhesive-metal-polymer film). The backward waves 44 radiated into absorber 45 are reflected by the graded boundary 49 and again reflected at another boundary and when it comes back to the PZT layer the phase of reflection is different for each different ray and the reflections with different phases are not added up constructively but rather effectively cancelled. Therefore, the effective attenuation is increased using this approach.

Figure 4:
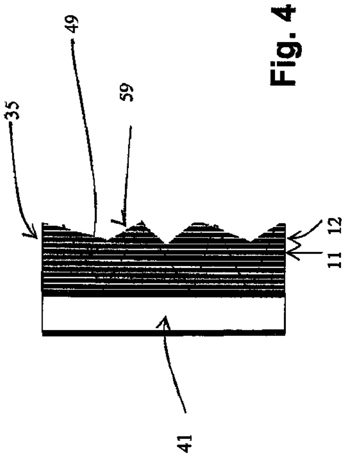
FIG. 4 is a schematic illustration of a graded back surface of a two element multilayer absorber according to an embodiment of the invention.

When the elemental layers are as represented by the two layers 11 (metal) and 12 (adhesive) as shown in FIG. 4, the optimum structure and method are different. Although it is possible to make an absorber region cut along a graded boundary 49, similar to the case in FIG. 3 where the cut out regions are removed, this is more difficult than the three layer case. Therefore in this case only the back most surface is made into a non-flat, graded surface 59.

Figure 5A:
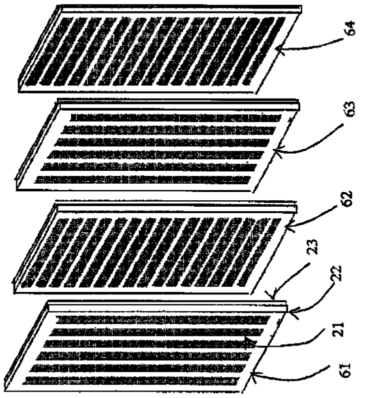
FIG. 5*a* is a schematic illustration showing layers of a grating metal multilayer absorber according to an embodiment of the invention.
Figure 6:
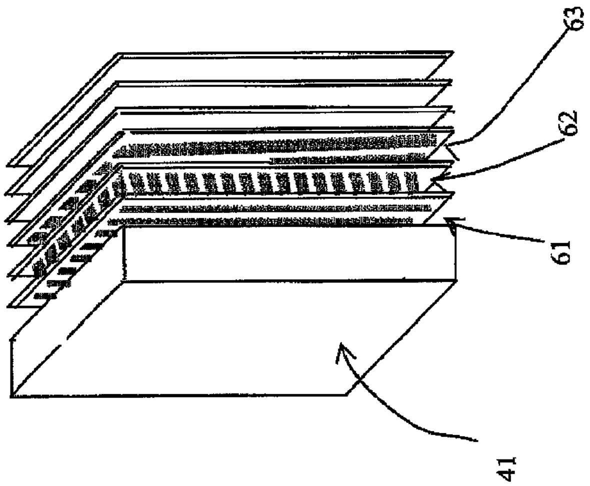
FIG. 6 is a schematic illustration of a layer structure of a multilayer absorber with arbitrarily different gratings for each layer according to an embodiment of the invention.

In order to increase the attenuation of a multilayer absorber, metal layer 21 on polymer film 22 is subdivided into narrow long strips forming grating 61 as shown in FIG. 5*a*. Adhesive 23 is disposed on one side. The grating 62 on the next layer is positioned with an angle (not necessarily a right angle as shown in FIG. 6) from the direction of first grating 61 and other layers 63 and 64 are similarly at different angles and with different periodicity (which may have an arbitrary period) and all the layers are bonded together. Such a structure makes a strong scattering agent for the main beam along with a strong absorption. However, as shown in FIG. 5*a*, a structure with a constant period for all layers where every other layer is at a right angle makes for strongly diffracted beams and the main beam is absorbed by exciting the diffracted beams. FIG. 6 shows the metal gratings 61, 62, 63, and so on with different angles to one another and combined with PZT layer 41 as a grating absorber. Adhesive (not shown) is used, and the space between each layer is shown larger for illustration purposes and the grating direction and period is shown to be unequal.

Figure 5B:
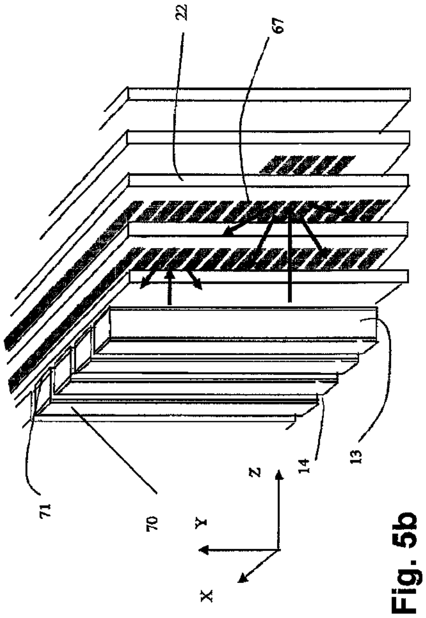
FIG. 5*b* is 2-2 composite transducer with grating multilayer absorber according to the principles of the present invention.

FIG. 5*b* shows a metal grating perpendicular to the long direction of the PZT in a 2-2 composite. Thick metal 67 is deposited on polymer layer 22 and all the layers are bonded together. FIG. 5*b* shows each polymer layer separated for illustration purposes. Each PZT element 13 has front 70 and back 71 electrodes and the space between PZT elements is filled with a polymer material 14 such as epoxy. Each PZT element may be driven with a different phase signal and the resulting acoustic beam direction may thus be controlled or scanned. The backward wave scattered or diffracted by the grating returns to the PZT elements but the waves are in the Y-Z plane and do not create coupling between the PZT elements. If the gratings are rotated 90 degrees parallel to the PZT elements (in the Y direction), scattered or diffracted waves are in the X-Z direction and these create coupling between the PZT elements. This makes the acoustic beam broader and reconstructed images become obscure.

Figure 7:
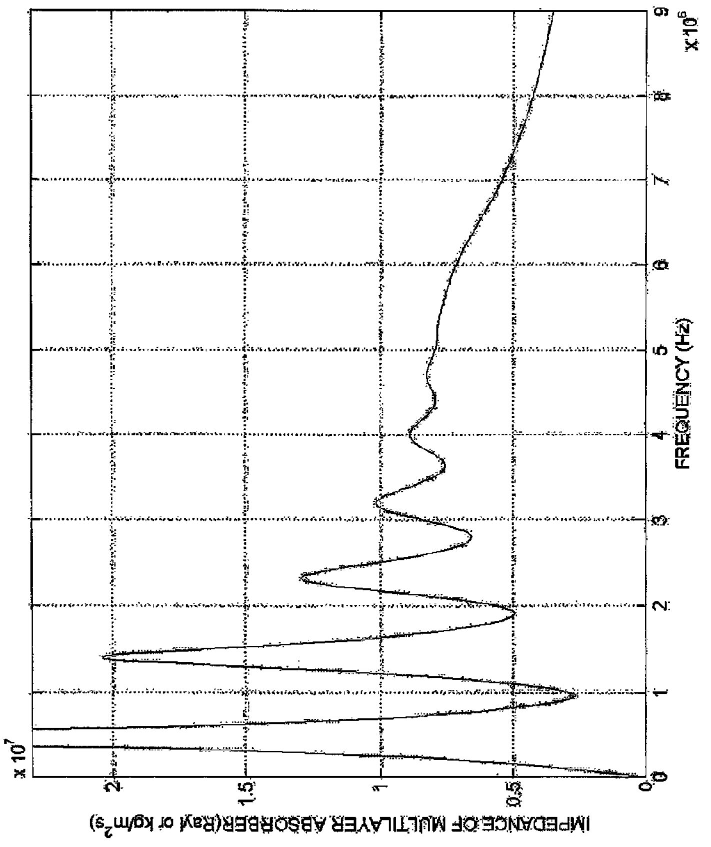
FIG. 7 is a graphical representation of acoustic impedance as a function of frequency for a multilayer absorber with 50 micrometer (μm) copper and 12 μm adhesive according to an embodiment of the invention shown in FIG. 1*b*.

The impedance characteristics of the exemplary multilayer absorbers have been calculated using a one dimensional model, which is based on wave analysis with suitable boundary conditions between one layer and another. The result agrees with aforementioned simplified design equations The impedance seen from one side surface 16 in FIG. 1*b* is calculated as a function of frequency and the result is shown in FIG. 7. This is for 50 um copper with 12 um adhesive with repetition of N=10. The impedance varies below 5 MHz around an average value of 8 MRayl. This impedance variation is due to the reflection from the end surface (17 in FIG. 1*b*). Since the attenuation becomes smaller at lower frequency, the reflection becomes stronger and therefore the variation of impedance caused by periodic constructive and destructive combination is higher at lower frequencies. The impedance also becomes lower above the cut off frequency (6.3 MHz). The cut off phenomenon is not sharp because of the loss in the adhesive.

Figure 8:
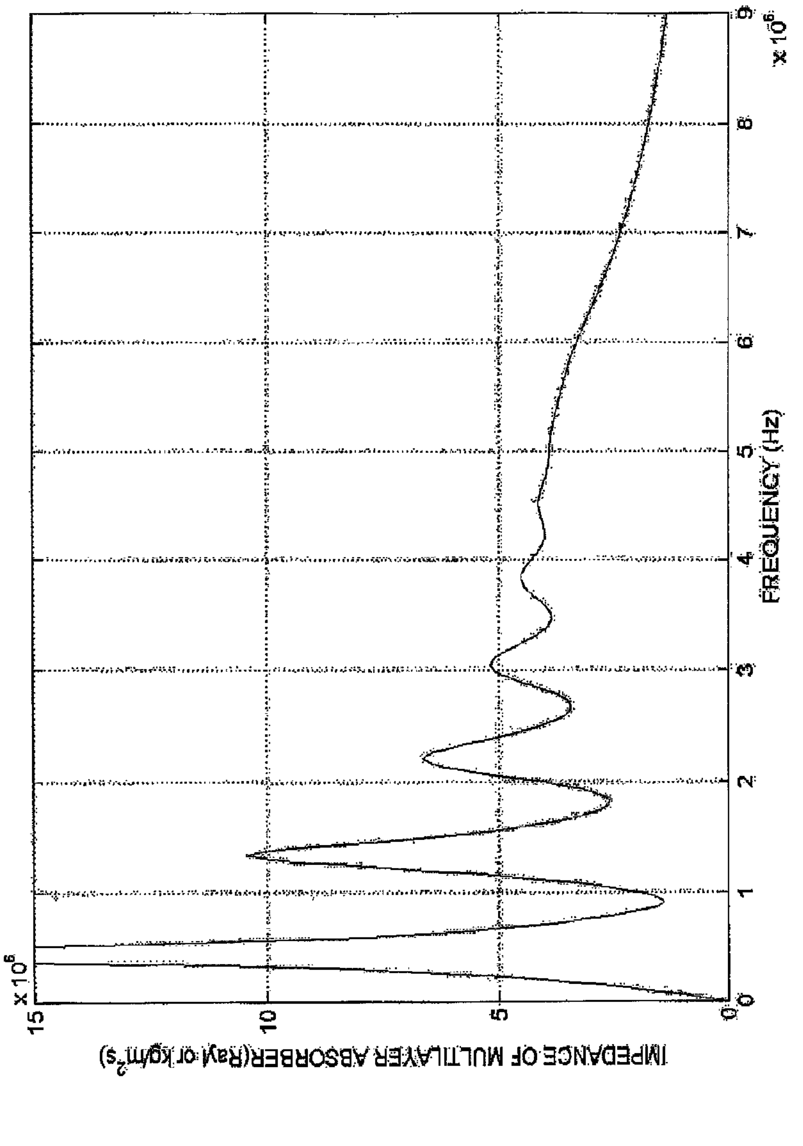
FIG. 8 is graphical representation of acoustic impedance as a function of frequency for a multilayer absorber with 25 μm copper and 25 μm adhesive according to an embodiment of the invention shown in FIG. 1*b*.

FIG. 8 shows impedance characteristics of another structure of 25 um copper and 25 um adhesive with N=10 using the same analysis as FIG. 7. As shown, the acoustic impedance is lower (4 MRayl) for a thicker adhesive as described in the design equations. It is understood that designs for frequencies different from the exemplary cases described herein can be accomplished. When each layer thickness is a factor of n times larger (or smaller to 1/n), fc becomes smaller to 1/n (or larger to n times) and Zo does not change as far as the thickness ratio of each layer remains changed.

Thus, as shown and described herein, a bonding layer of adhesive and a polymer layer have predictable, stable, reliable, long lasting absorber material behavior. Further, the piezoelectric material may be a uniform plate (non-composite) or PZT-polymer composite material. The inventive device includes a design of metal, polymer, and adhesive layers for desired impedance and absorption. Acoustic impedance and absorption for a structure of a plurality of metal deposited polymer layers bonded by adhesive are analyzed. Design equations to give necessary performance of the absorber structure have been shown. Examples of acoustic impedance and absorption for structures of various metal layers bonded by adhesive are provided. Side boundaries between gross multiple layer regions with metal and without metal make some angles to the surfaces. A layer of periodic narrow strips of metal on each polymer layer is bonded by adhesive. The metal strips on each layer are at a different and not necessarily periodic angles.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A backing absorber for use with an ultrasonic transducer, comprising:
- a first elemental multilayer having at least one homogeneous metal layer and at least one adhesive layer; and
- a second elemental multilayer having at least one homogeneous metal layer and at least one adhesive layer,
- wherein one of said at least one homogeneous metal layer and said at least one adhesive layer of said second multilayer is bonded to the other of said at least one homogeneous metal layer and said at least one adhesive layer of said first multilayer,
- wherein a planar surface of said backing absorber is adapted to be coupled to a corresponding planar surface of a vibrating layer of said ultrasonic transducer,
- wherein said plurality of elemental multilayers are effective to dampen ultrasonic signals emitted by said vibrating layer when said backing absorber is coupled to said vibrating layer, and
- wherein each elemental multilayer further includes a polymer layer.

2. The backing absorber of claim 1, wherein the backing absorber further comprises at least a third elemental multilayer having at least one homogeneous metal layer and at least one adhesive layer.

3. The backing absorber of claim 2, wherein each of said at least one homogeneous metal layers is deposited on a corresponding one of said polymer layers to form a periodic grating of metal strips wherein the direction and period of the grating is the same for each elemental layer.

4. The backing absorber of claim 2, wherein each of said at least one homogeneous metal layers is deposited on a corresponding one of said polymer layers to form a periodic grating of metal strips wherein the direction or period of the grating is different for each elemental layer.

5. The backing absorber of claim 4, wherein said direction of said grating is positioned at a 90 degree angle relative to the direction of the grating of each adjacent multilayer.

6. The backing absorber of claim 2, wherein each of said at least one homogeneous metal layers is partially deposited on a selected area of a corresponding one of said polymer layers to form a boundary grading for reflecting backwards waves in such a way as to increase effective attenuation.

7. The backing absorber of claim 1, wherein the vibrating layer comprises one of a monolithic PZT plate, a 1-3 PZT composite, and a 2-2 PZT composite.

8. The backing absorber of claim 3, wherein the vibrating layer comprises a 2-2 PZT composite having a plurality of elongated bars of PZT material and wherein the direction of the elongated metal area of the grating is perpendicular to said PZT bars.

9. A method of making a backing absorber for an ultrasonic transducer, comprising:
- forming a first multilayer element by coupling a first homogeneous metal layer to a first adhesive layer;
- forming a second multilayer element by coupling a second homogeneous metal layer to a second adhesive layer; and
- coupling at least one of said second homogeneous metal layer and said second adhesive layer to the other of said first homogeneous metal layer and said first adhesive layer,
- wherein a planar surface of said first multilayer element is configured to be coupled to a corresponding planar surface of a vibrating layer of said ultrasonic transducer for absorbing ultrasonic waves,
- wherein said forming further comprises first coupling a first and a second polymer layer to said first and second homogeneous metal layers, respectively.

10. The method of claim 9 further comprising:
- forming an additional multilayer element by coupling a third homogeneous metal layer to a third adhesive layer; and
- bonding said additional multilayer element to said first multilayer element.

11. The method of claim 10 further comprising:
- repeating said forming of said additional multilayers and said bonding of said additional multilayer elements until a predetermined acoustic absorption value has been reached.

12. The method of claim 11, wherein said forming further comprises depositing said homogeneous metal layer on a polymer layer to form a periodic grating of metal strips wherein the direction and period of the grating is the same for each elemental multilayer.

13. The method of claim 11, wherein said forming further comprises depositing said homogeneous metal layer on a polymer layer to form a periodic grating of metal strips wherein the direction or period of the grating is different for each elemental multilayer.

14. The method of claim 13, wherein said direction of said grating is positioned at a 90 degree angle relative to the direction of the grating of each adjacent multilayer.

15. The method of claim 10, wherein said forming further comprises partially depositing said homogeneous metal layer on a selected area of each of said at least one polymer layers to form a boundary grading for reflecting waves in such a way as to increase effective attenuation.

16. An ultrasonic transducer assembly, comprising:
- a vibrating layer for generating ultrasonic waves; and
- a backing absorber coupled to said vibrating layer for absorbing said ultrasonic waves, said backing absorber having a plurality of elemental multilayers, each elemental multilayer including:
  - a homogeneous metal layer,
  - a polymer layer, and
  - an adhesive layer.

17. The ultrasonic transducer assembly of claim 16, wherein the vibrating layer comprises one of a monolithic PZT plate, a 1-3 PZT composite, and a 2-2 PZT composite.

18. A method of making an ultrasonic transducer assembly, comprising:
- providing a vibrating layer for generating acoustic ultrasonic waves;

forming a plurality of multilayer elements wherein each multilayer element is formed by depositing a homogeneous metal layer on a polymer layer;

bonding said plurality of multilayer elements to one another by use of a plurality of adhesive layers to form a backing absorber; and bonding a planar surface of said backing absorber to a corresponding backplane of said vibrating layer to absorb said acoustic ultrasonic waves.

* * * * *